United States Patent [19]

McCormick et al.

[11] Patent Number: 5,293,114
[45] Date of Patent: Mar. 8, 1994

[54] FREQUENCY MEASUREMENT RECEIVER WITH MEANS TO RESOLVE AN AMBIGUITY IN MULTIPLE FREQUENCY ESTIMATION

[75] Inventors: William S. McCormick, Centerville; James B. Y. Tsui, Dayton, both of Ohio

[73] Assignee: The United States of America as represented by the Secretary of the Air Force, Washington, D.C.

[21] Appl. No.: 997,262

[22] Filed: Dec. 24, 1992

[51] Int. Cl.$^5$ .................... G06F 15/31; G01R 23/00
[52] U.S. Cl. .................... 324/76.22; 324/76.24; 324/76.21; 324/76.31; 342/195; 342/196; 342/162; 342/16; 364/484; 364/485
[58] Field of Search .................... 342/195, 196, 162; 364/484, 485; 324/76.22, 76.24, 76.21, 76.31, 76.19, 77.11

[56] References Cited

U.S. PATENT DOCUMENTS

| | | | |
|---|---|---|---|
| 4,556,982 | 12/1985 | Dunn | 324/76.31 |
| 4,757,253 | 7/1988 | Weber | 324/76.31 |
| 4,904,930 | 2/1990 | Nicholas . | |
| 4,937,583 | 6/1990 | Poinsard . | |
| 4,963,816 | 10/1990 | Tsui | 324/76.31 |
| 5,036,324 | 7/1991 | Lamper et al. . | |
| 5,099,194 | 3/1992 | Sanderson et al. . | |
| 5,099,243 | 3/1992 | Tsui et al. . | |
| 5,109,188 | 4/1992 | Sanderson et al. . | |
| 5,117,238 | 5/1992 | Silverstein et al. . | |
| 5,119,432 | 6/1992 | Hirsch | 364/484 |
| 5,122,732 | 6/1992 | Engeler et al. . | |

OTHER PUBLICATIONS

W. McCormick, J. B. Y. Tsui, V. L. Bakke, "A Noise Insensitive Solution to an Ambiguity Problem in Spectra Estimation," IEEE Transactions on Aerospace and Electronic Systems, Sep. 1989, vol. 25, No. 5 pp. 729–732.
Merrill Skolnik (Ed.) Radar Handbook, New York: McGraw Hill, 1970, pp. 19-12 to 19-16.

*Primary Examiner*—Kenneth A. Wieder
*Assistant Examiner*—Jose M. Solis
*Attorney, Agent, or Firm*—Bernard E. Franz; Thomas L. Kundert

[57] ABSTRACT

In multiple frequency estimation, the bandwidth and resolution of Fast Fourier Transform (FFT) based frequency estimators are limited by A/D converter sampling rate constraints and also by real-time computational requirements. The disclosed configuration uses a Modified Chinese Remainder Theorem of a paper entitled, "A Noise Insensitive Solution to an Ambiguity Problem in Spectra Estimation" by McCormick et al and a subsampling approach of U.S. Pat. No. 5,099,194 entitled, "Digital Frequency Measurement Receiver With Bandwidth Improvement Through Multiple Sampling of Real Signals" to resolve the frequency ambiguity problem. The configuration extends these ideas to the multiple frequency case. It significantly extends system bandwidth by operating I FFT units in parallel at specific sampling rates chosen to maximize system bandwidth for a fixed level of noise protection. Each FFT unit output is processed by a "peak detecting" algorithm that detects the M remainders of the M frequencies for the sampling frequency, $F_i$, of that particular FFT unit. Using a multiple frequency ambiguity resolution algorithm, the M frequencies are estimated from the I sets of M remainders. The configuration essentially resolves the $2\pi$ or aliasing ambiguity problem for multiple frequencies in a parallel, highly efficient manner. In its current configuration, the system is designed for complex signal inputs.

3 Claims, 2 Drawing Sheets

FREQUENCY MEASUREMENT RECEIVER WITH MEANS TO RESOLVE AN AMBIGUITY IN MULTIPLE FREQUENCY ESTIMATION

RIGHTS OF THE GOVERNMENT

The invention described herein may be manufactured and used by or for the Government of the United States for all governmental purposes without the payment of any royalty.

BACKGROUND OF THE INVENTION

The present invention relates generally to a Instantaneous Frequency Measurement (IFM) receiver with means to resolve an ambiguity in multiple frequency estimation, and more particularly to means to resolve the $2\pi$ ambiguity in multiple frequency estimation of complex signals.

The following United States patents are of interest.
U.S. Pat. No. 4,904,930—Nicholas
U.S. Pat. No. 4,937,583—Poinsard
U.S. Pat. No. 4,963,816—Tsui et al
U.S. Pat. No. 5,036,324—Lamper et al
U.S. Pat. No. 5,099,194—Sanderson et al
U.S. Pat. No. 5,099,243—Tsui et al
U.S. Pat. No. 5,109,188—Sanderson et al
U.S. Pat. No. 5,117,238—Silverstein et al
U.S. Pat. No. 5,122,732—Engeler et al A paper of interest is:
W. McCormick, J. B. Y. Tsui, V. L. Bakke, "A Noise Insensitive Solution to an Ambiguity Problem in Spectra Estimation," *IEEE Transactions on Aerospace and Electronic Systems.* Vol. 25, No. 5, Sep. 1989, pages 729–732.

The paper discloses a design procedure using the Chinese Remainder Theorem for solving a congruence problem of number theory for a given amount of noise protection, a stated frequency resolution, a minimum bandwidth and a fixed level of precision (bits) in a IFM receiver.

The references cited in the paper are also of interest. The invention is conceptually similar to the range ambiguity resolution problem in multiple prf pulse/doppler radar. See Skolnik, M. J. (Ed.) *Radar Handbook*, New York: McGraw Hill, 1970, pages 19-12 to 19-16.

Tsui et al in U.S. Pat. No. 4,963,816 disclose an Instantaneous frequency measurement receiver having two delay lines wherein frequency resolution is based on the Chinese Remainder Theorem. The theorem states that if an unknown number X is divided by a number a with a remainder $r_1$ and also divided by a number b with a remainder $r_2$, where a and b are relatively prime numbers, the number X can be determined uniquely from a, b, $r_1$ and $r_2$ if $X < ab$. For example, if $a=5$, $b=7$, $r_1=2$ and $r_2=1$, the Chinese remainder gives an X of 22.

Lamper et al in U.S. Pat. No. 5,036,324 disclose a pulse compression technique for a high duty rate radar, wherein a processor 16 employs parallel processing architecture utilizing Fast Fourier Transforms (FFT). FFT section of vector processor 106 includes three identical FFT units or engines 112a, 112b and 112c, respectively, which operate independently of each other and are separately programmable by the CPU.

Sanderson et al in U.S. Pat. No. 5,099,194 disclose a digital frequency measurement receiver with bandwidth improvement through multiple sampling of real signals. Two sets of uniform samples are used with slightly different sampling frequency, wherein each set is Fourier transformed independently and the frequency of the lowest aliases determined. Unambiguous determination of the signal frequency over a range far exceeding the Nyquist frequency is obtained except at a discrete set of points.

Tsui et al in U.S. Pat. No. 5,099,243 disclose a technique for extending the frequency range of a digital frequency measurement receiver, through multiple sampling of complex signals, which employs in-phase and quadrature components of the signal coupled with non-uniform sampling. Each set of complex samples is independently Fourier transformed, and the frequency of the lowest aliases permits unambiguous determination of the signal frequency over a range far exceeding the Nyquist frequency.

Sanderson et al in U.S. Pat. No. 5,109,188 disclose a technique for extending the frequency range of an instantaneous frequency measurement receiver, wherein a power divider is employed with two outputs. One output is supplied to a first A/D converter, and the other output is supplied via a delay device to a second A/D converter. A processor 60 receives the outputs of the two A/D converters 42, 44. The input signal is subjected to a known delay $\tau$ and both original and delayed signals are sampled simultaneously and Fourier transformed and both the phase and amplitudes calculated.

Silverstein et al in U.S. Pat. No. 5,117,238 and Enoeler et al in U.S. Pat. No. 5,122,732 utilize a matrix based super resolution spectral estimation algorithms and parallel architectures. An embodiment utilizes a windowing element and FFT to perform low pass filtering. Various embodiment are disclosed.

The remaining patent references are included for general background information.

SUMMARY OF THE INVENTION

An objective of the invention is to significantly expand the bandwidth of an FFT frequency estimator.

By using I units FFT estimators operating in parallel, the configuration according to the invention can estimate M frequency values (if $M<I$) over a system bandwidth that is an order of magnitude greater than the bandwidths of the individual estimators. By choosing I and the sampling rates of the FFT units properly, the M frequencies can also be given a fixed level of noise protection over the entire operating bandwidth.

The invention can be considered as a combination of two ideas that are related to EW receivers. The first idea is contained in the Tsui et al in U.S. Pat. No. 5,099,243 entitled, "Digital Frequency Measurement Receiver With Bandwidth Improvement Through Multiple Sampling of Complex Signals" (see also the Sanderson et al U.S. Pat. No. 5,099,194 entitled, "Digital Frequency Measurement Receiver With Bandwidth Improvement Through Multiple Sampling of Real Signals"). The second idea is contained in the McCormick et al paper entitled, "A Noise Insensitive Solution to an Ambiguity Problem in Spectra Estimation". The configuration according to the invention uses the Modified Chinese Remainder Theorem of the above mentioned paper and the subsampling approach of the patent to resolve the frequency ambiguity problem. The invention relates to a configuration which extends these ideas to the multiple frequency case.

In multiple frequency estimation, the bandwidth and resolution of Fast Fourier Transform (FFT) based frequency estimators are limited by A/D converter sampling rate constraints and also by real-time computational requirements. The configuration disclosed herein significantly extends system bandwidth by operating I FFT units in parallel at specific sampling rates chosen to maximize system bandwidth for a fixed level of noise protection. Each FFT unit output is processed by a "peak detecting" algorithm that detects the M remainders of the M frequencies for the sampling frequency, $F_i$, of that particular FFT unit. Using a multiple frequency ambiguity resolution algorithm, the M frequencies are estimated from the I sets of M remainders. The configuration essentially resolves the $2\pi$ or aliasing ambiguity problem for multiple frequencies in a parallel, highly efficient manner. In its current configuration, the system is designed for complex signal inputs.

Advantages and New Features

The advantages of the invention are enumerated as follows:
  (1) The method can resolve M frequencies with (M+1) FFT units operating in parallel.
  (2) The method provides a noise protection of q(Hz) which can be increased at the expense of bandwidth.
  (3) For reasonable levels of noise protection, the system bandwidth can be expanded by an order of magnitude as compared with the bandwidths of the FFT units. Much greater bandwidths can be realized if a three FFT unit single frequency resolution algorithm is employed.
  (4) The use of a two FFT unit, single frequency $2\pi$ ambiguity resolution algorithm can be implemented with commercially available ROMs.
  (5) The entire invention lends itself to parallel processing.

An additional advantage that deserves special mention is the ability to handle any two frequencies separated by an integer multiple of the sampling frequency of one of the FFT units. In this case, both frequencies would fold or alias into the same remainder value. Because of the sort algorithm, however, both frequencies would achieve their $$\begin{bmatrix} 1 \\ 2 \end{bmatrix}$$

repeats even though their remainders are the same value in one FFT unit.

DETAILED DESCRIPTION

Figure 1:
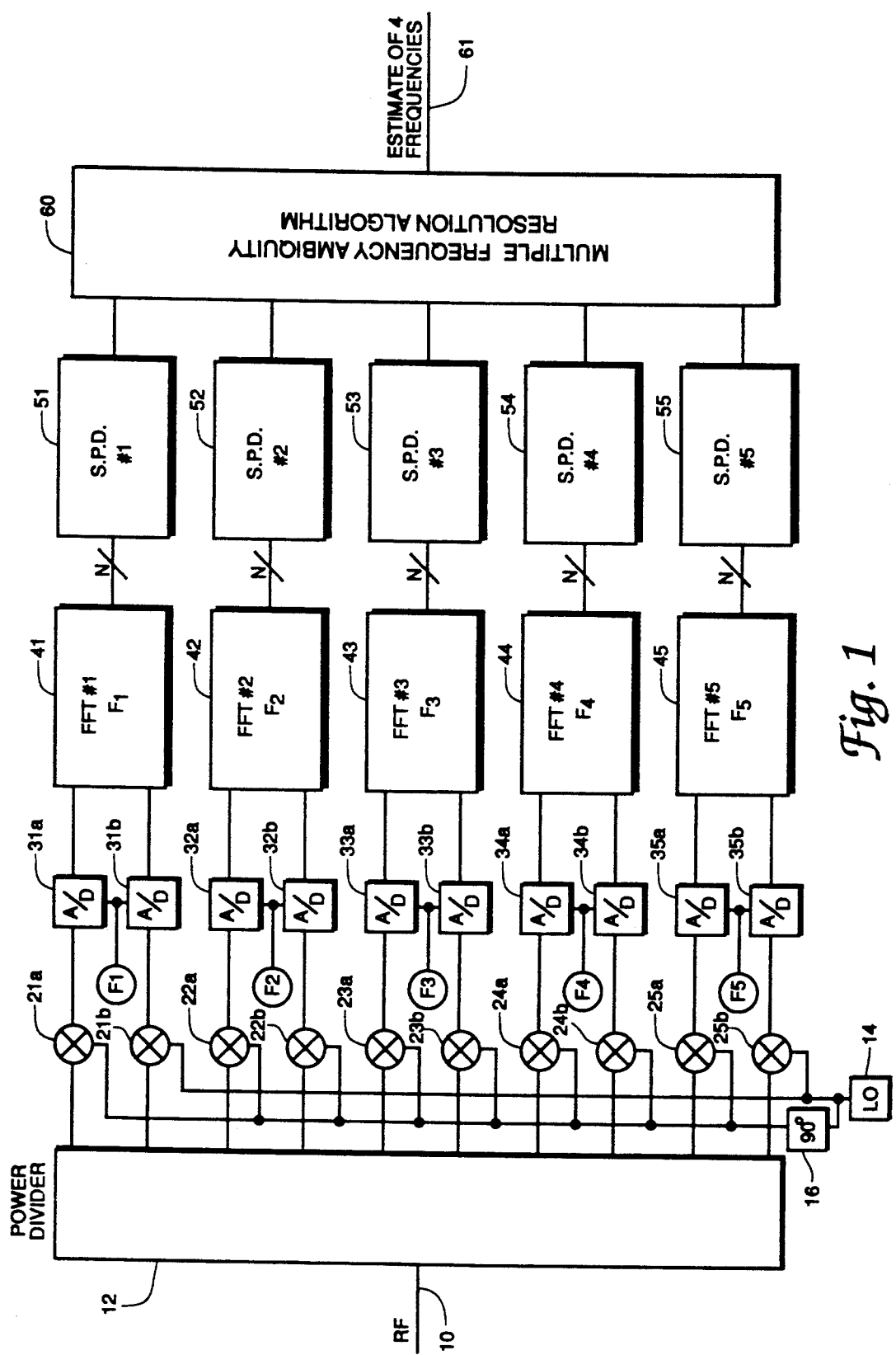
FIG. 1 is a block diagram showing a five-FFT estimator/four-frequency version of a configuration according to the invention.

FIG. 1 illustrates a five-FFT estimator/four-frequency version of a configuration according to the invention. In the figure, an input of up to four frequencies is fed into five FFT units 41-45 operating at sampling frequencies of $F_1$, $F_2$, $F_3$, $F_4$, $F_5$ respectively. The input is considered as complex in FIG. 1. The outputs of the FFT units 41-45 are coupled to inputs of spectrum peak detector units 51-55 respectively. The outputs of the spectrum peak detector units are coupled to a unit 60 which performs a multiple frequency ambiguity resolution algorithm. The output of unit 60 on line 61 provides an estimate of four frequencies. Each of the FFT units 41-45 will operate on N points (e.g., N=128) and will provide unambiguous bandwidths of $F_1$, $F_2$, $F_3$, $F_4$, $F_5$ respectively.

The input in FIG. 1 is shown with an RF input on line 10 coupled via power divider apparatus 12 to ten mixers 21a-25b. Signals from a local oscillator 14 are supplied directly to five mixers 21b-25b to provide in-phase signals, and via a 90° circuit 16 to the five mixers 21a-25a to provide quadrature signals. The outputs of the first pair of mixers 21a and 21b are coupled via respective analog-to-digital converters 31a and 31b operating at a first sampling frequency $F_1$ to provide complex digital input signals to the first FFT unit 41. In like manner the other FFT units 42-45 have inputs via pairs of mixers and a pairs of A/D converters at respective sampling frequencies $F_2$-$F_5$. In general, the sampling frequency for each FFT unit may be designated as $F_i$. Note that the input at line 10 may have simultaneous pulse signals with up to four frequencies, which are coupled as complex signals to each of the five FFT units.

Because of A/D converter sampling speed limitations, the values of $F_i$ will usually be less than 500 MHz and aliasing will occur for frequencies over a 2 GHz bandwidth. For each frequency, $f_m$, and each receiver the FFT unit will measure the remainder, $a_{mi}$, which is related to $f_m$ for complex input as $$a_{mi} + K_{mi}F_i \qquad \begin{array}{l} 1 \leq m \leq M \\ 1 \leq i \leq I \end{array} \qquad (1)$$

for M frequencies, where $K_{mi}$ is an unknown integer and represents the aliasing ambiguity. A complete estimate of $f_m$ requires a knowledge of $K_{mi}$ and the measured $a_{mi}$ for M frequencies using I FFT units. Using a novel multiple frequency ambiguity resolution algorithm, the invention solves this aliasing ambiguity problem in the multiple frequency case.

Referring to FIG. 1, the Spectrum Peak Detector (S.P.D.) scans the magnitudes of the N outputs of a given FFT and identifies all frequency bins, $n_{mi}$, where the frequency magnitude exceeds the maximum anticipated sidelobe level. Spectral windowing will be included in the FFTs which can lower the sidelobe level to improve the dynamic range for the system. As a final processing step before the ambiguity resolution algorithm, the $n_{mi}$ output of the S.P.D.s must be converted to the corresponding $a_{mi}$ which is done with ROM look-up tables using the following transformation, $$a_{mi} = \text{Nearest Integer}\left\{ \left[ \frac{n_{mi}}{N} \right] F_i \right\} \qquad (2)$$

where a dedicated ROM generates $a_{mi}$, ($1 \leq m \leq M$), for each of the I FFT units.

In the single frequency case (M=1), solving the aliasing problem of (1) is equivalent to solving the simultaneous congruence problem of number theory. A closed form solution of the problem is available in the form of the Chinese Remainder Theorem (CRT) which unfortunately, requires noise-free, unperturbed remainders, $a_{mi}$. Recently we have developed a noise-protected modification of the CRT that exchanges bandwidth for noise protection (W. McCormick, J. B. Y. Tsui, V. L. Bakke, "A Noise Insensitive Solution to an Ambiguity Problem in Spectra Estimation," *IEEE Transactions on Aerospace and Electronic Systems*, Vol. 25, No. 5, Sep. 1989, pages 729–732). In particular, for $I=2$, $M=1$, a solution can be obtained that protects the remainder from a noise perturbation of q(Hz) and gives the correct resolved frequency to within q over a bandwidth, B, given as $$B = \frac{F_1 F_2}{4q+1}. \quad (3)$$

Using properties from number theory, the $F_1 F_2$ are related as $$F_1 = (4q+1)p_1 \quad (4)$$
$$F_2 = (4q+1)p_2$$

where $p_1$, $p_2$ are relatively prime integers. For the $I=2$ case, the mapping of the two remainders to the resolved frequency can be done with ROM look-up tables. The bandwidth, B, of (3) can be expanded with three receivers to give $$B = \frac{F_1 F_2 F_3}{(4q+1)^2} \quad (5a)$$

where
$$F_1 = (4q+1)p_1$$
$$F_2 = (4q+1)p_2 \quad (5b)$$
$$F_3 = (4q+1)p_3$$

and $p_1$, $p_2$, $p_3$ are pairwise prime integers. Unfortunately, the three receiver, single frequency resolution cannot be reduced to look-up table implementation. Accordingly, the two FFT unit, single frequency ROM resolution forms one of the essential steps in the multiple frequency resolution algorithm.

Figure 2:
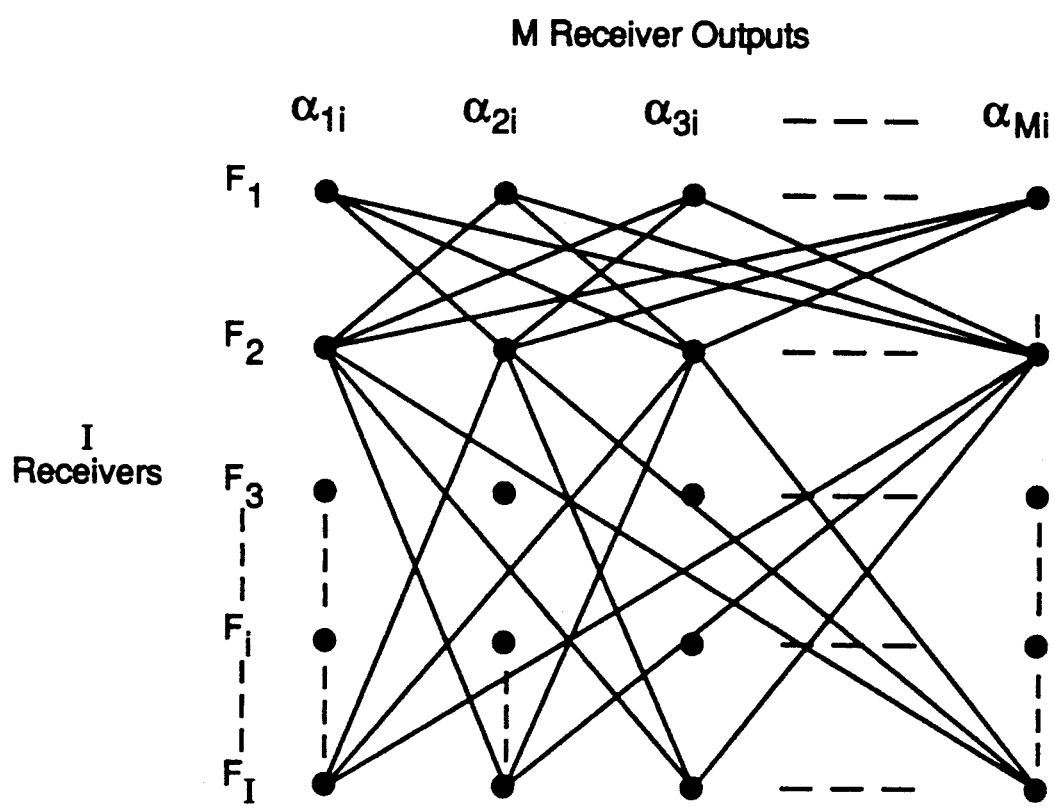
FIG. 2 is a diagram showing a general I receiver configuration for k=2, in which spurious remainder pairings for ($F_1,F_2$) and ($F_2,F_I$) receiver groupings are illustrated.

The proposed invention exhaustively considers all possible $$M^2 \begin{bmatrix} I \\ 2 \end{bmatrix}$$

groupings of $a_{jl}$ ($1 \leq j \leq M$; $1 \leq l \leq 2$) remainders for all the M remainders in the subset of 2 FFTs used in the single frequency resolution. The symbol $$\begin{bmatrix} I \\ 2 \end{bmatrix}$$

represents the binomial coefficient which gives the number of unique groups of FFT units out of a total number of I FFT units. It can be concluded that there are $M^2$ possible groupings or combinations of remainders or resolved frequencies for each of the $$\begin{bmatrix} I \\ 2 \end{bmatrix}$$

possible groups of 2 FFT units out of a total of I units of FFTs. Each of these remainder combinations produces one resolved frequency using the single frequency method. Of the $$M^2 \begin{bmatrix} I \\ 2 \end{bmatrix}$$

frequencies, $$M \begin{bmatrix} I \\ 2 \end{bmatrix}$$

represent true frequencies, while $$(M^2 - M) \begin{bmatrix} I \\ 2 \end{bmatrix}$$

represent incorrect frequencies resulting from a false or spurious grouping of remainders. Given the error insensitivity to noise perturbations, each of the M true frequencies should repeat exactly $$\begin{bmatrix} I \\ 2 \end{bmatrix}$$

times while the incorrect frequencies can only repeat at random. FIG. 2 illustrates the multiple receiver configuration for general I. (FIG. 2 is a diagram showing a general I receiver configuration for $k=2$, in which spurious remainder pairings for ($F_1,F_2$) and ($F_2,F_1$) receiver groupings are illustrated). Pairings between remainders of grouped receivers are represented by line segments and remainders or FFT unit outputs are represented by nodes. The bandwidth of the multiple frequency resolution algorithm, $B_\mu$, will equal the minimum of all $$\begin{bmatrix} I \\ 2 \end{bmatrix}$$

bandwidths, B, as given by equation (3).
From the $$M^2 \begin{bmatrix} I \\ 2 \end{bmatrix}$$

output frequencies generated by the exhaustive algorithm, a sort algorithm must select the M true frequencies based on the number of repeats. An outline of the sort method follows:

(1) The first FFT grouping or pairing is called the reference grouping and the candidate true frequencies are taken from the $M^2$ outputs of this reference grouping based on the number of times a reference frequency repeats in the remaining $$\left[\left[\begin{array}{c}I\\2\end{array}\right]-1\right]_{FFT}$$

unit groupings.

(2) Each of the $M^2$ frequency values in the reference FFT grouping will be compared to the $M^2$ frequencies of each of the remaining $$\left[\left[\begin{array}{c}I\\2\end{array}\right]-1\right]_{FFT}$$

groupings. The repeat total of a reference frequency is increased by one if the reference frequency value is within 2q of at least one frequency in each of the remaining $$\left[\left[\begin{array}{c}I\\2\end{array}\right]-1\right]_{FFT}$$

groups. A given frequency in the reference FFT grouping is only allowed to repeat once in each of the $$\left[\left[\begin{array}{c}I\\2\end{array}\right]-1\right]_{FFT}$$

unit groupings. The 2q tolerance is necessary since the sort is based on the comparison of two potentially noise perturbed frequencies with a noise protection of q(Hz).

(3) Since all of the I FFT units receive the same M true frequencies, it follows that all M noise protected true frequencies will repeat exactly $$\left[\begin{array}{c}I\\2\end{array}\right]$$

(including the reference) times in the sort algorithm. Multiple spurious repeats within the same FFT grouping are counted only once which reduces the effect of spurious repeats.

(4) The resolved frequencies are defined as those reference frequencies that repeat exactly $$\left[\begin{array}{c}I\\2\end{array}\right]$$

times.

A detailed analysis and simulation has indicated that M frequencies can be resolved correctly with a noise protection level, q, provided the number of FFT units, I, is equal to or greater than (M+1). Under this condition, there is a negligible probability that spurious pairings will produce repeats equal to or greater than $$\left[\begin{array}{c}I\\2\end{array}\right].$$

As an illustrative example, we will consider a I=5, M=4 example with a noise protection of q=1 (MHz) and with FFT unit bandwidths of 85, 95, 105, 115, 125 MHz respectively. The system bandwidth is the minimum of the $$\left[\begin{array}{c}5\\2\end{array}\right]=10$$

bandwidths of the FFT groupings. Using expression (3) for the bandwidths of the individual FFT unit groupings the system bandwidth can be easily shown to equal 1615 MHz.

It is understood that certain modifications to the invention as described may be made, as might occur to one with skill in the field of the invention, within the scope of the appended claims. Therefore, all embodiments contemplated hereunder which achieve the objects of the present invention have not been shown in complete detail. Other embodiments may be developed without departing from the scope of the appended claims.

We have observed that for real signal inputs to the FFT units, there is additional ambiguity, so that for M input signal frequencies, more than M+1 FFT units are needed.

What is claimed is:

1. A frequency measurement receiver system capable of resolving up to M signal frequencies $f_m$ ($1 \leq m \leq M$) appearing on an RF input line within a same measurement interval, comprising I FFT units and I spectrum peak detector units, M and I being positive integers with I being greater than M, each FFT unit having an input coupled to the RF input line via mixers and analog-to-digital (A/D) converter means to provide complex signals having digital in-phase and quadrature components, processor means for multiple frequency ambiguity resolution, each FFT unit having N outputs coupled to one of the peak detector units, and each of the peak detector units having outputs coupled to the processor means;

the A/D converter means for each of the I FFT units having a different sampling speed $F_i$ ($1 \leq i \leq I$), wherein for each signal frequency, $f_m$, each FFT unit includes means for measuring a remainder, $a_{mi}$, which is related to $f_m$ for complex input as $$f_m = a_{mi} + K_{mi}F_i \quad (1)$$

for the M signal frequencies, where $K_{mi}$ is an unknown integer and represents an aliasing ambiguity;

wherein each spectrum peak detector unit includes means for scanning the magnitudes of the N outputs of the FFT unit to which it is coupled and identifying all frequency bins, $n_{mi}$, where frequency magnitude exceeds a maximum anticipated sidelobe level;

wherein the processor means includes a plurality of read-only memory units (ROM) having look-up tables for converting the $n_{mi}$ outputs of the spectrum peak detector units to corresponding remainders $a_{mi}$ using the following transformation, $$a_{mi} = \text{Nearest Integer}\left(\left[\frac{n_{mi}}{N}\right]F_i\right) \quad (2)$$

where a dedicated ROM generates $a_{mi}$, ($1 \leq m \leq M$), for each of the I FFT units;

wherein the processing means includes means coupled to the read-only memory units for solving the aliasing ambiguity for each subset of two FFT units and one signal frequency $f_m$, which protects the remainder from a noise perturbation of q(Hz) and gives the correct resolved frequency to within q over a bandwidth, B, given as $$B = \frac{F_1 F_2}{4q + 1}, \quad (3)$$

wherein using properties from number theory, the $F_1 F_2$ are related as $$F_1 = (4q+1)p_1 \quad (4)$$

$$F_2 = (4q+1)p_2$$

where $p_1$, $p_2$ are relatively prime integers;
wherein the processing means includes means for exhaustively considering all possible $$M^2 \begin{bmatrix} I \\ 2 \end{bmatrix}$$

groupings of $a_{jl}$ ($1 \leq j \leq M$; $1 \leq l \leq 2$) remainders for all the M remainders in the subset of 2 FFTs used in the single frequency resolution, wherein the symbol $$\begin{bmatrix} I \\ 2 \end{bmatrix}$$

represents a binomial coefficient which gives the number of unique groups of FFT units out of a total number of I FFT units, there being $M^2$ possible groupings or combinations of remainders or resolved frequencies for each of the $$\begin{bmatrix} I \\ 2 \end{bmatrix}$$

possible groups of 2 FFT units out of a total of I FFT units, each of these remainder combinations producing one resolved frequency using the single frequency method, wherein of the $$M^2 \begin{bmatrix} I \\ 2 \end{bmatrix}$$

frequencies, $$M \begin{bmatrix} I \\ 2 \end{bmatrix}$$

represent true frequencies, while $$(M^2 - M) \begin{bmatrix} I \\ 2 \end{bmatrix}$$

represent incorrect frequencies resulting from a false or spurious grouping of remainders; wherein the bandwidth of the multiple frequency resolution algorithm, $B_\mu$, will equal the minimum of all $$\begin{bmatrix} I \\ 2 \end{bmatrix}$$

bandwidths, B, as given by equation (3);
wherein the processing means further includes sorting means for selecting the M true frequencies based on the number of repeats, from the $$M^2 \begin{bmatrix} I \\ 2 \end{bmatrix}$$

output frequencies generated.

2. A frequency measurement receiver system according to claim 1, wherein the sorting means comprises:
(a) means providing a first FFT grouping or pairing as a reference grouping in which candidate true frequencies are taken from the $M^2$ outputs of this reference grouping based on the number of times a reference frequency repeats in the remaining $$\left[\begin{bmatrix} I \\ 2 \end{bmatrix} - 1\right] FFT$$

unit groupings;
(b) means for comparing each of the $M^2$ frequency values in the reference FFT grouping to the $M^2$ frequencies of each of remaining $$\left[\begin{bmatrix} I \\ 2 \end{bmatrix} - 1\right] FFT$$

groupings, the repeat total of a reference frequency being increased by one if the reference frequency value is within 2q of at least one frequency in each of the remaining $$\left[\begin{bmatrix} I \\ 2 \end{bmatrix} - 1\right] FFT$$

groups, a given frequency in the reference FFT grouping being only allowed to repeat once in each of the $$\left[\begin{bmatrix} I \\ 2 \end{bmatrix} - 1\right] FFT$$

unit groupings;
(c) means for counting multiple spurious repeats within the same FFT grouping only once;
(d) means for defining the resolved frequencies as those reference frequencies that repeat exactly $$\begin{bmatrix} I \\ 2 \end{bmatrix}$$

times.

3. A frequency measurement receiver system capable of resolving up to M signal frequencies $f_m$ ($1 \leq m \leq M$) appearing on an RF input line within a same measurement interval, comprising I FFT units and I spectrum peak detector units, M and I being positive integers with I being greater than M, each FFT unit having an input coupled to the RF input line via analog-to-digital (A/D) converter means to provide digital signals, processor means for multiple frequency ambiquity resolution, each FFT unit having N outputs coupled to one of the peak detector units, and each of the peak detector units having outputs coupled to the processor means;

the A/D converter means for each of the I FFT units having a different sampling speed $F_i$ ($1 \leq i \leq I$), wherein for each signal frequency, $f_m$, each FFT unit includes means for measuring a remainder;

wherein each spectrum peak detector unit includes means for scanning the magnitudes of the N outputs of the FFT unit to which it is coupled and identifying all frequency bins, $n_{mi}$, where frequency magnitude exceeds a maximum anticipated sidelobe level;

wherein the processor means includes a plurality of read-only memory units (ROM) having look-up tables for converting the $n_{mi}$ outputs of the spectrum peak detector units to corresponding remainders;

wherein the processing means includes means coupled to the read-only memory units for solving the aliasing ambiquity for each subset of two FFT units and one signal frequency $f_m$, which protects the remainder from a noise perturbation of q(Hz) and gives the correct resolved frequency to within q over a bandwidth, B, given as $$B = \frac{F_1 F_2}{2q + 1},$$

wherein using properties from number theory, the $F_1 F_2$ are related as $F_1 = (4q+1)p_1$ $F_2 = (4q+1)p_2$ where $p_1$, $p_2$ are relatively prime integers;

wherein the processing means includes means for exhaustively considering all possible groupings of remainders for all the remainders in the subset of 2 FFTs used in the single frequency resolution;

wherein the processing means further includes sorting means for selecting the M true frequencies based on the number of repeats, from the output frequencies generated.

* * * * *